(12) United States Patent
Park et al.

(10) Patent No.: US 7,567,106 B2
(45) Date of Patent: Jul. 28, 2009

(54) DUTY CYCLE CORRECTION CIRCUIT, CLOCK GENERATION CIRCUITS, SEMICONDUCTOR DEVICES USING THE SAME, AND METHOD FOR GENERATING CLOCK SIGNAL

(75) Inventors: Moon-sook Park, Seoul (KR); Kyu-hyoun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 54 days.

(21) Appl. No.: 11/496,447

(22) Filed: Aug. 1, 2006

(65) Prior Publication Data

US 2007/0090866 A1 Apr. 26, 2007

(30) Foreign Application Priority Data

Oct. 26, 2005 (KR) .................. 10-2005-0101490

(51) Int. Cl.
*H03K 3/017* (2006.01)

(52) U.S. Cl. .................. 327/175; 327/172; 327/157; 327/159

(58) Field of Classification Search .......... 327/172–176, 327/291, 295, 296, 155–159, 164–166
See application file for complete search history.

(56) References Cited

U.S. PATENT DOCUMENTS

| | | | | |
|---|---|---|---|---|
| 5,572,158 A | * | 11/1996 | Lee et al. ................ | 327/175 |
| 6,169,434 B1 | * | 1/2001 | Portmann ................. | 327/175 |
| 6,329,882 B1 | | 12/2001 | Fayneh et al. ............ | 331/10 |
| 6,456,165 B1 | | 9/2002 | Kelkar ..................... | 331/17 |
| 6,504,438 B1 | | 1/2003 | Chang et al. ............. | 327/17 |
| 6,570,423 B1 | | 5/2003 | Trivedi et al. ............ | 327/157 |
| 6,603,339 B2 | * | 8/2003 | Atallah et al. ............ | 327/175 |
| 6,611,161 B1 | | 8/2003 | Kumar et al. ............. | 327/157 |
| 6,833,743 B2 | * | 12/2004 | Gu et al. .................. | 327/175 |
| 6,903,585 B2 | * | 6/2005 | Keaveney ................. | 327/148 |
| 7,015,739 B2 | * | 3/2006 | Lee et al. .................. | 327/175 |
| 7,202,714 B2 | * | 4/2007 | Park ......................... | 327/149 |
| 2004/0178837 A1 | * | 9/2004 | Hsieh ........................ | 327/175 |
| 2006/0145745 A1 | * | 7/2006 | Deivasigamani et al. ... | 327/291 |

FOREIGN PATENT DOCUMENTS

KR 2004-084516 10/2004

\* cited by examiner

*Primary Examiner*—An T Luu
(74) *Attorney, Agent, or Firm*—Roylance, Abrams, Berdo & Goodman, L.L.P.

(57) ABSTRACT

A semiconductor device and method of generating clock signals where a phase lock loop (PLL), or a delay lock loop (DLL), comprises a duty cycle correction circuit (DCC) having a shared charge pump and a plurality of amplification parts. The plurality of amplification parts generate internal clock signals. The shared charge pump adjusts voltage level of control signal (VC) in response to the internal clock signals and provides the control signal VC to each of the amplification parts.

30 Claims, 12 Drawing Sheets

FIG. 1 (CONVENTIONAL)

FIG. 2 (CONVENTIONAL)

FIG. 3 (CONVENTIONAL)

FIG. 4 (CONVENTIONAL)

FIG. 5 (CONVENTIONAL)

CONVENTIONAL

CONVENTIONAL

DUTY CYCLE CORRECTION CIRCUIT, CLOCK GENERATION CIRCUITS, SEMICONDUCTOR DEVICES USING THE SAME, AND METHOD FOR GENERATING CLOCK SIGNAL

CROSS-REFERENCE TO RELATED APPLICATIONS

This invention claims priority under 35 U.S.C. 119 on Korean Application No. P2005-101490, filed Oct. 26, 2005; the entire contents of which are hereby incorporated by reference.

BACKGROUND OF THE INVENTION

1. Field of the Invention

The present invention relates to a clock generation circuit and a method for generating a clock signal. More particularly, the present invention relates to a duty cycle correction circuit, a clock generation circuit using the same, and a method for generating clock signals with the use thereof.

2. Description of the Related Art

Semiconductor devices which employ clock generation circuits often include phase lock loop (PLL) circuits or delay lock loop (DLL) circuits. A conventional PLL comprises a voltage controlled oscillator (VCO), which generates relatively higher frequency internal clock signals, and a duty cycle correction circuit (DCC), which comprises at least a pair of amplification part and corresponding charge pump. On the other hand, a conventional DLL comprises a voltage controlled delay line (VCDL) and a DCC, which likewise comprises at least a pair of amplification part and corresponding charge pump.

Figure 1:
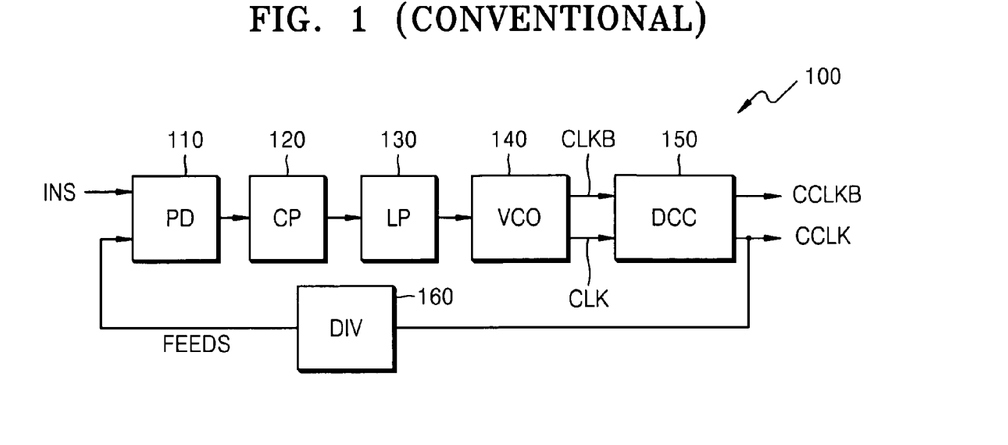
FIG. 1 is a block diagram showing the configuration of a conventional phase lock loop (PLL) circuit.

Referring to FIG. 1, a conventional PLL circuit 100 includes a phase detector (PD) 110, a charge pump (CP) 120, a loop filter (LP) 130, a voltage controlled oscillator (VCO) 140, a divider (DIV) 160 and a duty cycle correction (DCC) circuit 150.

During operation, PD 110 generates a control signal in response to a phase difference between an external clock signal (INS) and a feedback clock signal (FEEDS) and provides the control signal to CP 120. The control signal comprises an UP signal and a DN signal (not shown). When the phase of INS leads that of a feedback clock signal, PD 110 is activated and generates an activated UP signal. In contrast, when the phase of the INS lags than that of the FEEDS, PD 110 generates an activated DN signal. CP 120 and LP 130 increase the level of control voltage (VC) in response to the activated UP signal, and decrease the level of VC in response to the activated DN signal. The control voltage is input to VCO 140.

VCO 140 generates two intermediate clock signals CLK and CLKB which are received by DCC 150. The phase difference between CLK and CLKB is about 180 degrees. DCC eliminates a duty cycle error existing in each of the intermediate clock signals CLK and CLKB and generates first internal clock signals CCLKB and CCLK which keep a normal duty cycle (50%:50%). The phase difference between CCLKB and CCLK is also about 180 degrees.

DIV 160 receives one of the first internal clock signals (which is CCLK in the example of FIG. 1), and then outputs the divided clock signal FEEDS, whose frequency equals the frequency of INS. That is, in order to acquire first internal clock signals CCLKB and CCLK having a higher frequency than that of external clock signal INS, DIV 160 is provided in the PLL. On the other hand, when a PLL doesn't have a divider, such as DIV 160, the frequency of first internal clock signals CCLKB, CCLK equals the frequency of external clock INS.

Figure 2:
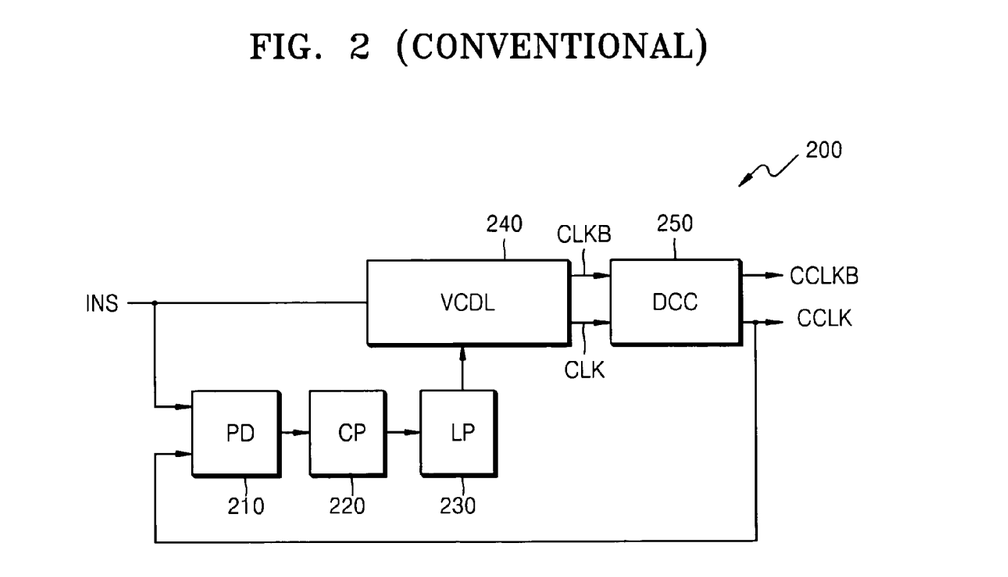
FIG. 2 is a block diagram showing the configuration of a conventional delay lock loop (DLL) circuit.

Referring to FIG. 2, a conventional DLL circuit 200 includes VCDL 240, rather than VCO 140 of PLL 100, as well as phase detector (PD) 210, a charge pump (CP) 220, a loop filter (LP) 230 and a duty cycle correction (DCC) circuit 250.

During operation, VCDL 240 generates intermediate clock signals CLKB, CLK which are delayed by a predetermined time from an external clock signal INS, in response to an output signal of a charge pump CP 220 and LP 230 (which is generally composed of a low pass filter). Then, DCC 250 generates first internal clock signals CCLKB, CCLK which keep normal duty cycle after eliminating a duty cycle error which may exist in the each of intermediate clock signals CLK, CLKB.

Figure 3:
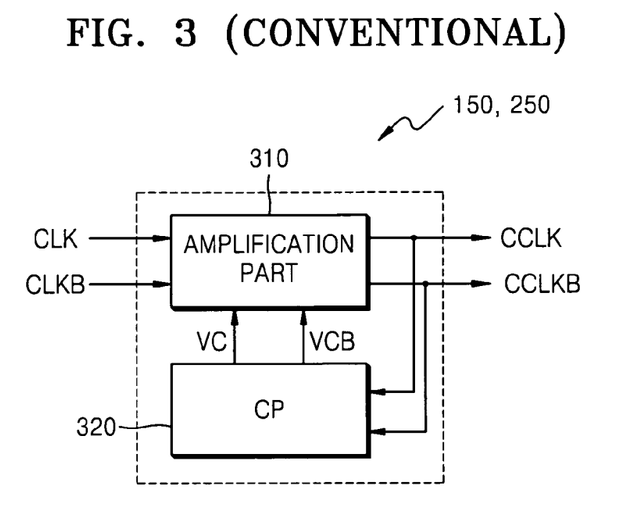
FIG. 3 is a block diagram showing the configuration of a conventional duty cycle correction (DCC) circuit which may be employed in the PLL of FIG. 1, or in the DLL of FIG. 2.

Referring to FIG. 3, a conventional DCC circuit 150,250 is described in more detail as follows. DCC 150,250 may receive differential clock signals CLK and CLKB having a phase difference of about 180 degrees, as shown in FIG. 3 (which will be described further with reference to FIG. 4), and may also receive a single-ended clock signal (which will be described further with reference to FIG. 5). In the case of differential clock signals, the duty cycle errors of the intermediate clock signals CLK, CLKB are corrected in response to control signals VC,VCB generated from a charge pump CP 320 of the DCC circuit. CP 320 adjusts the voltage value of the control signals VC, VCB in response to signals CCLK, CCLKB so that an amplification part (AP) 310 adjusts the duty cycle of signals CLK,CLKB according to the voltage value of each of VC,VCB to output first internal clock signals CCLK,CCLKB keeping normal duty cycle (50%:50%).

Figure 12A:
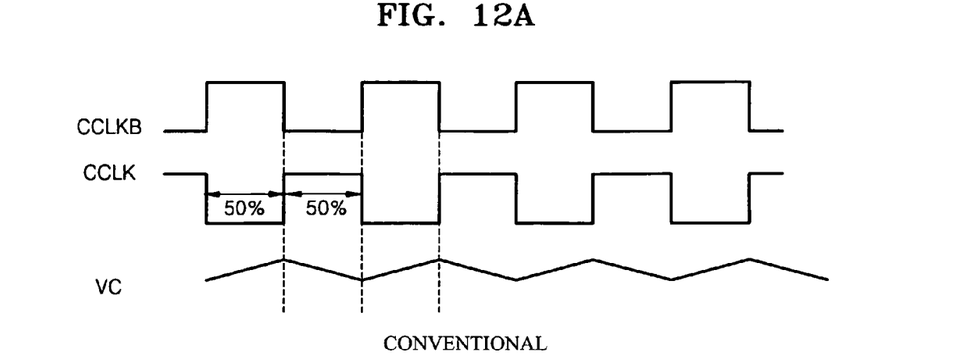
FIG. 12a is a timing diagram illustrating a normal duty cycle of a first internal clock signal in a conventional clock generating circuit.

Referring to FIG. 12a, when intermediate clock signals CLK/CLKB do not have a duty cycle error, first internal clock signals CCLK/CCLKB also do not have a duty cycle error. Thus, the average voltage of control signal VC for one clock period remains constant at every interval of all clock periods.

Figure 13A:
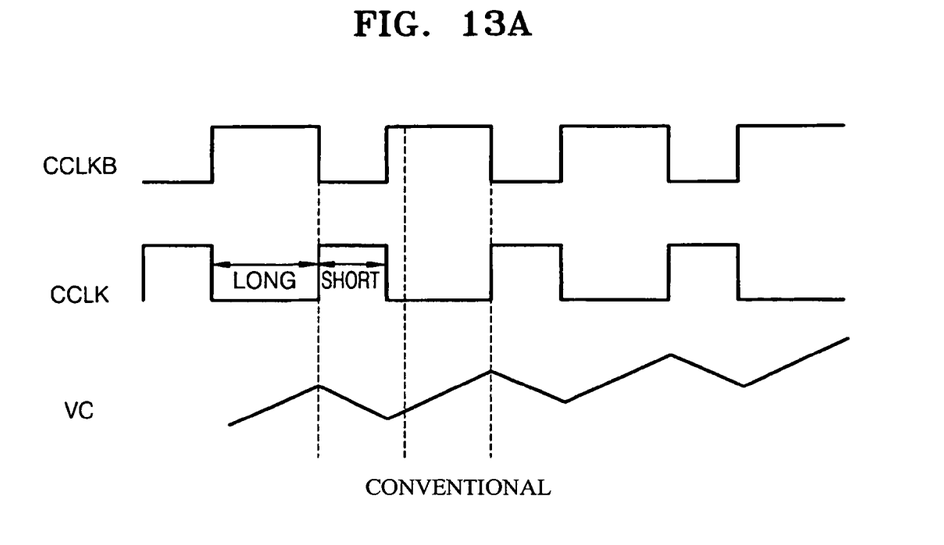
FIG. 13a is a timing diagram illustrating an abnormal duty cycle of a first internal clock signal in a conventional clock generating circuit.

Referring to FIG. 13a, when intermediate clock signals CLK/CLKB have a duty cycle error, first internal clock signals CCLK/CCLKB also have a duty cycle error. Accordingly, CP 320 of the DCC circuit 150,250 operates to adjust the voltage level of control signal VC to control AP 310 to correct the duty cycle error of the clock signals. As shown, the average voltage value of a control signal VC for one clock period differs from every interval until CCLK/CCLKB are restored to normal duty cycle by operation of the DCC circuit.

Figure 4:
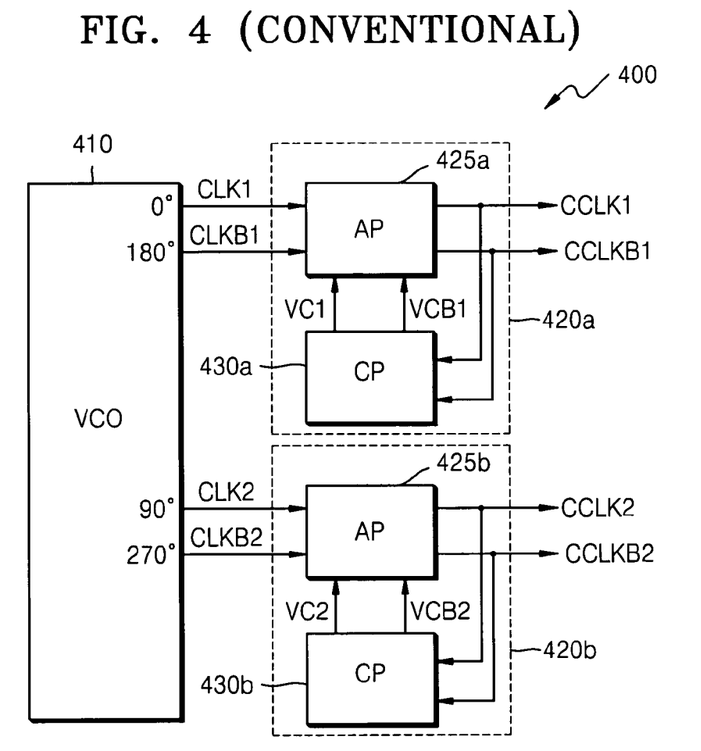
FIG. 4 is a block diagram showing the interconnections of a conventional DCC circuit processing differential clock signals.

Referring to FIG. 4, VCO 410 outputs two pairs of differential clock signals CLK1/CLKB1, CLK2/CLKB2. In this case, DCC 400 comprises two charge pumps (CP) 430a,430b arranged in a one to one correspondence with amplification parts (AP) 425a,425b, as shown by blocks 420a and 420b, to correct duty cycle errors of each of the two pairs of differential clock signals. While FIG. 4 illustrates a relationship between VCO 410 and DCC 400 in a PLL circuit, one of ordinary skill in the art will appreciate that a similar arrangement between a VCDL and a DCC would exist in a DLL circuit where a VCDL would be used in place of the VCO 410.

Figure 5:
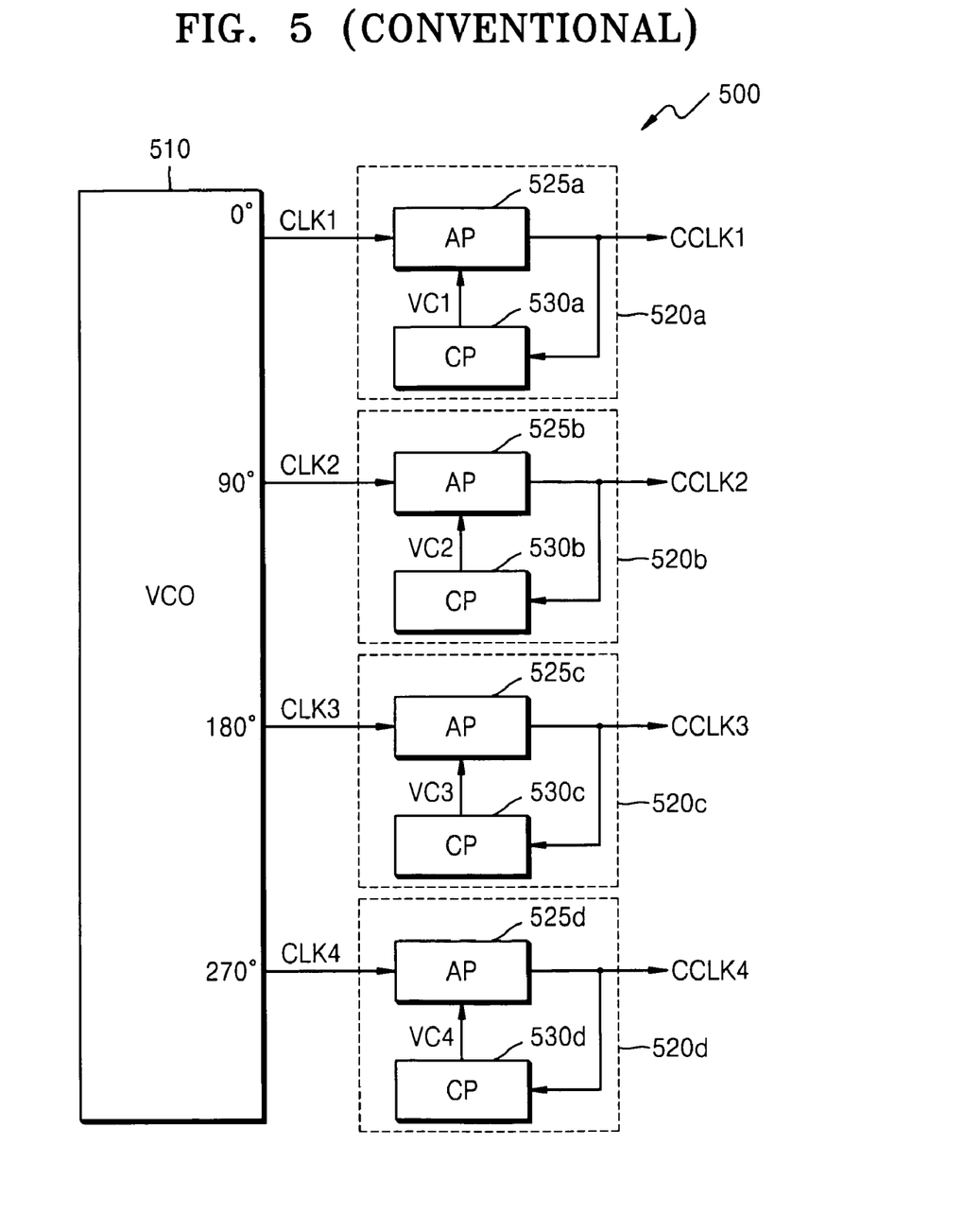
FIG. 5 is a block diagram showing the interconnections of a conventional DCC circuit processing single-ended clock signals.

Referring to FIG. 5, VCO 510 outputs four single-ended clock signals CLK1,CLK2,CLK3,CLK4. In this case, DCC 500 comprises four charge pumps (CP) 530a,530b,530c, 530d arranged in a one to one correspondence with amplification parts (AP) 425a,425b,425c,425d as shown by blocks 520a, 520b, 520c and 520d, to correct duty cycle errors of each of the four single-ended clock signals. The duty cycle errors of the intermediate clock signals CLK1,CLK2,CLK3, CLK4 are corrected in response to control signals VC1,VC2, VC3,VC4 generated from CPs 530a,530b,530c,530d, respectively, which adjust the voltage values of the control signals VC1,VC2,VC3,VC4 in response to signals CCLK1, CCLK2,CCLK3,CCLK4 so that APs 425a,425b,425c,425d adjust the duty cycle of signals CLK1,CLK2,CLK3,CLK4 according to the voltage value of each of VC1,VC2,VC3, VC4, respectively, to output duty cycle corrected first internal clock signals CCLK1,CCLK2,CCLK3,CCLK4.

As in the case of FIG. 4, while FIG. 5 illustrates a relationship between VCO 510 and DCC 500 in a PLL circuit, one of ordinary skill in the art will appreciate that a similar arrangement between a VCDL and a DCC would exist in a DLL circuit where a VCDL would be used in place of the VCO 510.

As can be seen from the foregoing description, in conventional clock generation circuits, a charge pump for duty cycle correction is arranged in correspondence with each of the amplification parts which receives intermediate clock signals and generates first internal clock signals. The plurality of charge pumps required in duty cycle correction circuits of conventional semiconductor devices leads to high power consumption and requires a large chip area.

SUMMARY OF THE INVENTION

Accordingly, there is a need for an improved digital circuit where a clock generation circuit is more compact and has reduced power consumption.

An aspect of the present invention is to address at least the above problems and/or disadvantages and to provide at least the advantages described below. Accordingly, an aspect of the present invention is to facilitate at least lower power consumption and chip size reduction in semiconductor devices, such as memory devices, using clock generating circuits.

Certain exemplary embodiments of the present invention provide a clock generating circuit, and a method for generating a clock signal, where a DCC comprises a plurality of amplification parts generating first internal clock signals and at least one shared charge pump for adjusting the voltage level of a control signal VC in response to the first internal clock signals and providing the control signal VC to each of the amplification part.

According to an exemplary embodiment of the present invention, a duty cycle correction circuit is configurable for use in a clock generation circuit and comprises a first amplification circuit configured to receive a first pair of an intermediate differential clock signals, and to output a first pair of internal clock signals, a second amplification circuit configured to receive a second pair of the intermediate differential clock signals, and to output a second pair of internal clock signals, and a second charge pump configured to receive the first and second pair of the internal clock signals, and to output a second control signal based on the first and second pair of the internal clock signals. The first and second amplification circuits adjust duty cycles of the first and second pair of the intermediate differential clock signals, respectively.

According to another exemplary embodiment of the present invention, a duty cycle correction circuit is configurable for use in a clock generation circuit and comprises a first amplification circuit configured to receive a first intermediate single-ended clock signal, and to output a first internal clock signal, a second amplification circuit configured to receive a second intermediate single-ended clock signal, and to output a second internal clock signal, and a second charge pump configured to receive the first and second internal clock signals, and to output a second control signal based on the first and second internal clock signals. The first and second amplification circuits adjust duty cycles of the first and second intermediate single-ended clock signals, respectively.

According to yet another exemplary embodiment of the present invention, a method for generating a clock signal comprises generating a first and second pair of intermediate differential clock signals, inputting the first pair of the intermediate differential clock signals into a first amplification circuit to generate a first pair of internal clock signals, inputting the second pair of the intermediate differential clock signals into a second amplification circuit to generate a second pair of internal clock signals, inputting the first and second pair of the internal clock signals into a second charge pump to generate a second control signal based on the first and second pair of the internal clock signals, and inputting the second control signal into at least one of the first and second amplification circuits to adjust duty cycles of the first and second pair of the intermediate differential clock signals, respectively.

According to yet another exemplary embodiment of the present invention, a method for generating a clock signal comprises generating a first and second intermediate single-end clock signals, inputting the first intermediate single-end clock signal into a first amplification circuit to generate a first internal clock signal, inputting the second intermediate single-end clock signal into a second amplification circuit to generate a second internal clock signal, inputting the first and second internal clock signals into a second charge pump to generate a second control signal based on the first and second internal clock signals, and inputting the second control signal into at least one of the first and second amplification circuits to adjust duty cycles of the first and second intermediate single-end clock signals, respectively.

According to yet another exemplary embodiment of the present invention, a charge pump circuit comprises a first input configured to receive a first internal clock signal from a first amplification circuit, a second input configured to receive a second internal clock signal from a second amplification circuit and an output configured to send a control signal to at least one of the first and second amplification circuits. The control signal is based on the first and second internal clock signals.

According to yet another exemplary embodiment of the present invention, a method of correcting a duty cycle error in a clock generation circuit comprises outputting a first internal clock signal from a first amplification circuit to a charge pump, outputting a second internal clock signal from a second amplification circuit to the charge pump, generating a control signal based on the first and second internal clock signals, and sending the control signal from the charge pump to at least one of the first and second amplification circuits.

BRIEF DESCRIPTION OF THE DRAWINGS

The above and other objects, features, and advantages of certain embodiments of the present invention will be more apparent from the following description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 6:
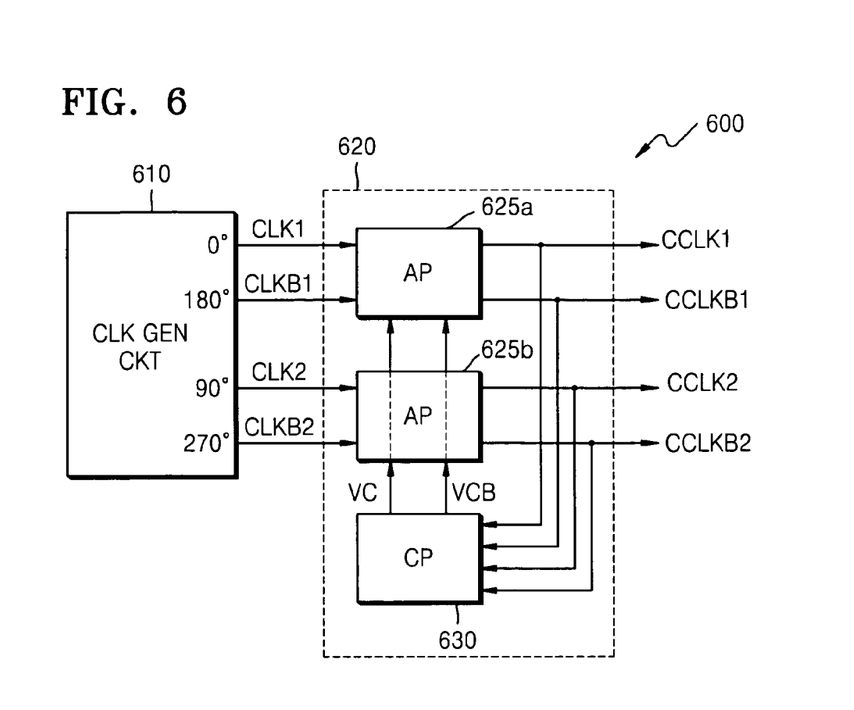
FIG. 6 is a block diagram showing an exemplary implementation of a clock generation circuit according to an exemplary embodiment of the present invention.

Referring to FIG. 6, a semiconductor device 600 according to an exemplary embodiment of the present invention comprises a clock generation circuit 610 and a duty cycle correction circuit DCC 620. In an exemplary implementation, a PLL may be employed, in which case clock generation circuit 610 may be implemented by a VCO. In another exemplary implementation, a DLL may be employed, in which case clock generation circuit 610 may be implemented by a VCDL.

As shown in the FIG. 6, DCC circuit 620 according to an exemplary embodiment of the present invention is implemented by shared charge pump CP 630 (instead of independent charge pumps of a conventional DCC circuit as shown in, for example, FIG. 4) to compensate for duty cycle errors of each of intermediate differential clock signals CLK1/CLKB1, CLK2/CLKB2. Accordingly, the chip area as well as the power consumption caused by the charge pumps of the DCC can be reduced compared to the conventional arrangement. The shared CP of the DCC circuit controls the voltage value of VC/VCB in response to the duty cycle's average value of signals CCLK1/CCLKB1, CCLK2/CCLKB2. VC/VCB output by the shared CP to AP 625a may be the same as, or different from, VC/VCB output to AP 625b.

Figure 7:
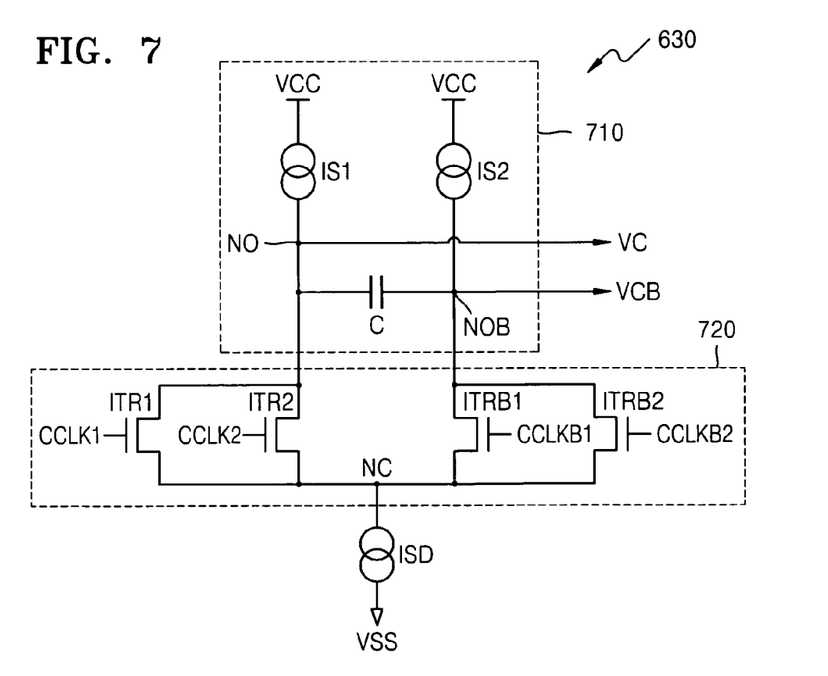
FIG. 7 is a circuit diagram showing an exemplary implementation of a charge pump according to an exemplary embodiment of the present invention.

Referring to FIG. 7, in an exemplary implementation of the present invention, shared CP 630 comprises an output part 710 and an input driver 720. Output part 710 comprises a first current source IS1, a second current source IS2, and a capacitive element C connected with respect to nodes NO and NOB as shown in FIG. 7. Herein, the capacitive element C operates as a low pass filter. Input driver 720 comprises a driving source ISD which is connected at node NC to transistors ITR1 and ITR2, each of the ITR1 and ITR2 receiving one of input signals CCLK1 and CCLK2, and transistors ITRB1 and ITRB2, each of the ITRB1 and ITRB2 receiving one of input signals CCLKB1 and CCLKB2.

Figure 9:
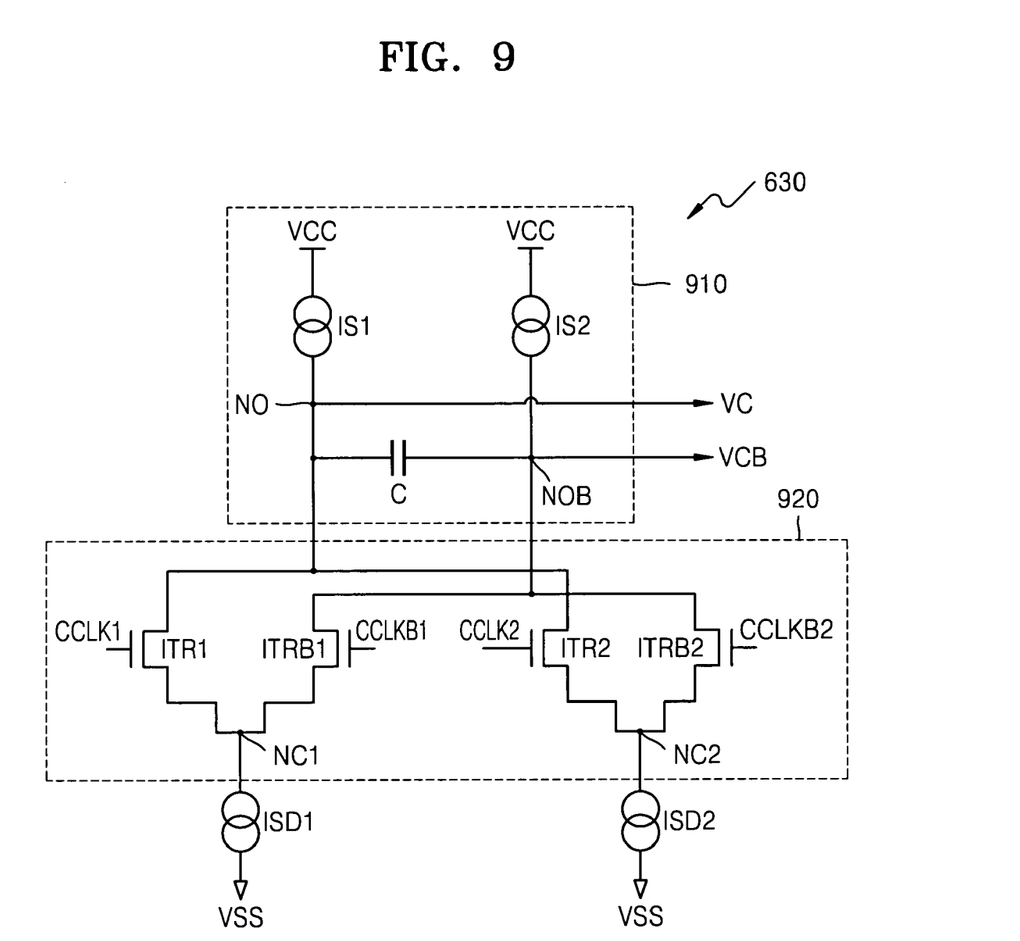
FIG. 9 is a circuit diagram showing another exemplary implementation of a charge pump according to an exemplary embodiment of the present invention.

Referring to FIG. 9, in another exemplary implementation of the present invention, shared CP 630 comprises an output part 910 and an input driver 920. Unlike the arrangement of FIG. 7, here the input driver 920 comprises two driving current sources. First driving current source ISD1 is connected at node NC1 to transistors ITR1 and ITRB1, while second driving current source ISD2 is connected at node NC2 to transistors ITR2 and ITRB2.

Figure 8:
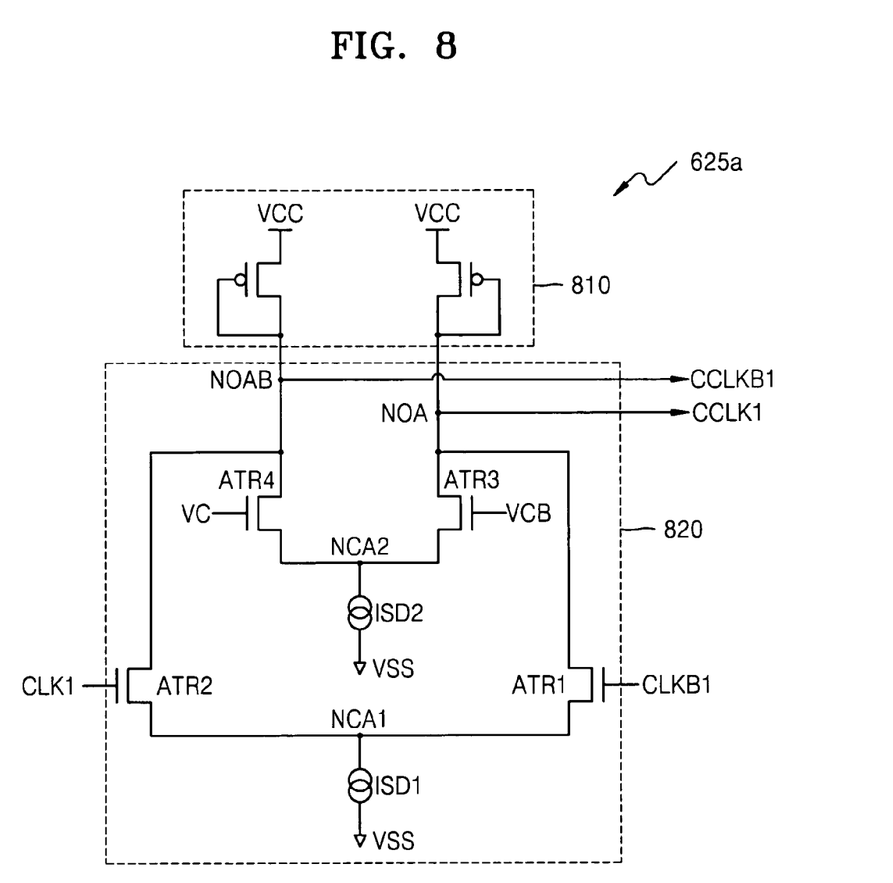
FIG. 8 is a circuit diagram showing an exemplary implementation of an amplification part according to an exemplary embodiment of the present invention.

Referring to FIG. 8, in an exemplary implementation of the present invention, AP 625a (and/or AP 625b) comprises a load part 810 and a control part 820 configured as shown. That is, intermediate clock signals CLK1/CLKB1 are received at ATR2/ATR1 which are connected at NCA1 to a first driving current source ISD1. On the other hand, VC/VCB output by the shared CP are received at ATR4/ATR3 which are connected at NCA2 to a second driving current source ISD2. Signals CCLK1/CCLKB1 are output at nodes NAOB/NOA.

Figure 12B:
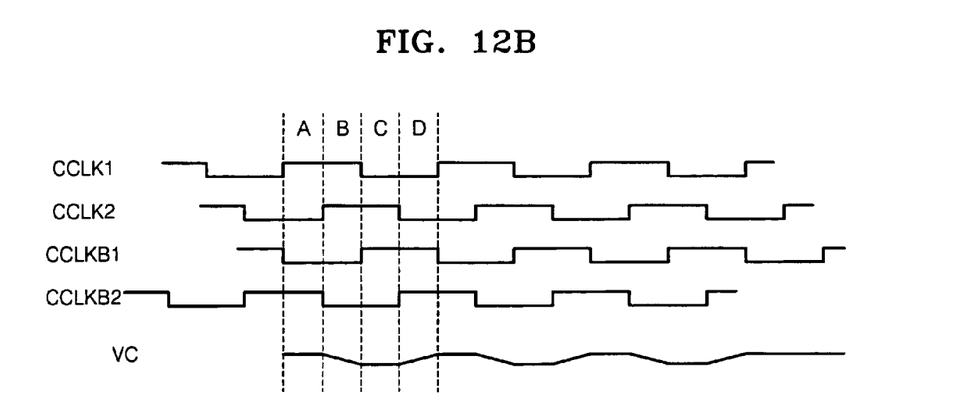
FIG. 12b is a timing diagram illustrating a normal duty cycle of a first internal clock signal in a clock generating circuit according to an exemplary implementation of the present invention.
Figure 13B:
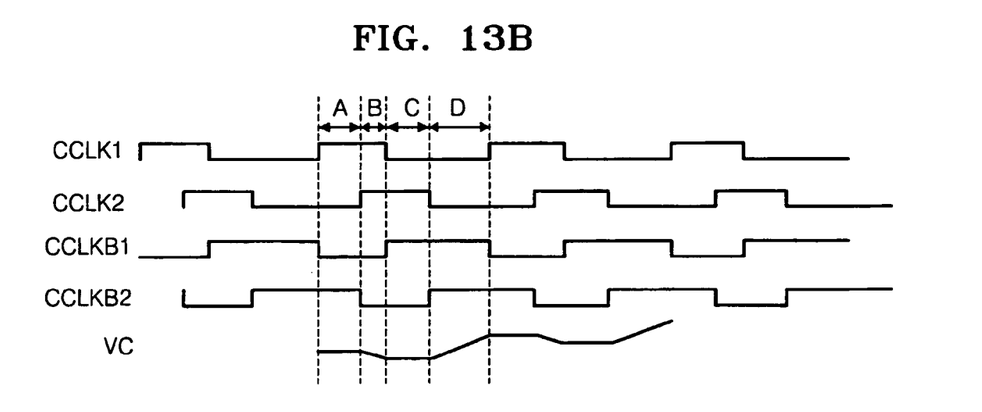
FIG. 13b is a timing diagram illustrating an abnormal duty cycle of a first internal clock signal in a clock generating circuit according to an exemplary implementation of the present invention.

Referring to FIGS. 12b and 13b, an example of a method for generating a control signal according to an embodiment of the present invention is described as follows.

As shown in FIG. 12b, when intermediate clock signals CLK1/CLKB1, CLK2/CLKB2 do not have a duty cycle error, first internal clock signals CCLK1/CCLKB1, CCLK2/CCLKB2 also do not have a duty cycle error.

In the interval A of FIG. 12b, a clock signal CCLK1 related to node NO and a clock signal CCLKB2 related to node NOB are both high. Thus, the voltage drop at node NO is the same as that at node NOB. Accordingly, VC voltage level remains constant.

In the interval B of FIG. 12b, only the two clock signals CCLK1 and CCLK2 related to node NO are high, so that an additional voltage drop occurs at node NO due to an additional activated transistor (ITR2), while voltage increases at node NOB because all transistors located at NOB node are turned off. Thus, VC voltage level decreases as shown.

In the interval C of FIG. 12b, clock signal CCLK2 related to node NO and clock signal CCLKB1 related to node NOB are both high. Thus, the voltage drop at node NO is the same as that at node NOB. Accordingly, VC voltage level remains constant.

In the interval D of FIG. 12b, only the two clock signals CCLKB1 and CCLKB2 related to node NOB are high, so that an additional voltage drop occurs at node NOB due to an additional activated transistor (ITRB2), while voltage increases at node NO because all transistors are turned off. Thus, VC voltage level increases as shown.

As shown in FIG. 12b, the average VC voltage level is the same from one interval to the next because there is no duty cycle error in the intermediate clock signals. Accordingly, the DCC does not need to adjust for duty cycle error. As shown in FIG. 12b, a ripple of the control voltage signal VC according to an exemplary implementation of the invention also decreases compared to that of the control voltage signal VC of a conventional DCC of FIG. 12a.

As shown in FIG. 13b, when intermediate clock signals CLK1/CLKB1, CLK2/CLKB2 have a duty cycle error, first internal clock signals CCLK1/CCLKB1, CCLK2/CCLKB2 also have the duty cycle error.

In the interval A of FIG. 13b, a clock signal CCLK1 related to node NO and a clock signal CCLKB2 related to node NOB are both high. Thus, the voltage drop at node NO is the same as that at node NOB. Accordingly, VC voltage level remains constant.

In the interval B of FIG. 13b, only the two clock signals CCLK1 and CCLK2 related to node NO are high, so that an additional voltage drop occurs at node NO due to an additional activated transistor (ITR2), while voltage increases at node NOB because all transistors located at NOB node are turned off. Thus, the VC voltage level decreases as shown.

In the interval C of FIG. 13b, clock signal CCLK2 related to node NO and clock signal CCLKB1 related to node NOB are both high. Thus, the voltage drop at node NO is the same as that at node NOB. Accordingly, the VC voltage level remains constant.

In the interval D of FIG. 13b, only the two clock signals CCLKB1 and CCLKB2 related to node NOB are high, so that an additional voltage drop occurs at node NOB due to an additional activated transistor (ITRB2), while voltage increases at node NO because all transistors are turned off. Thus, VC voltage level increases as shown. In an exemplary implementation, VC voltage increases for a long time at interval D, while decreasing for short time at interval B.

As shown in FIG. 13b, the average VC voltage level is not the same from one interval to the next because there is a duty cycle error in the intermediate clock signal. That is, in the example of FIG. 13b, the average value of VC voltage increases slightly from one clock period to the next until substantially eliminating duty cycle error existing in the intermediate clock signal.

During duty cycle error correction according to an exemplary implementation of the present invention, the average VC voltage increases gradually to make the high interval of CCLK become longer until the high interval of CCLK is finally identical with low interval of CCLK.

Figure 10:
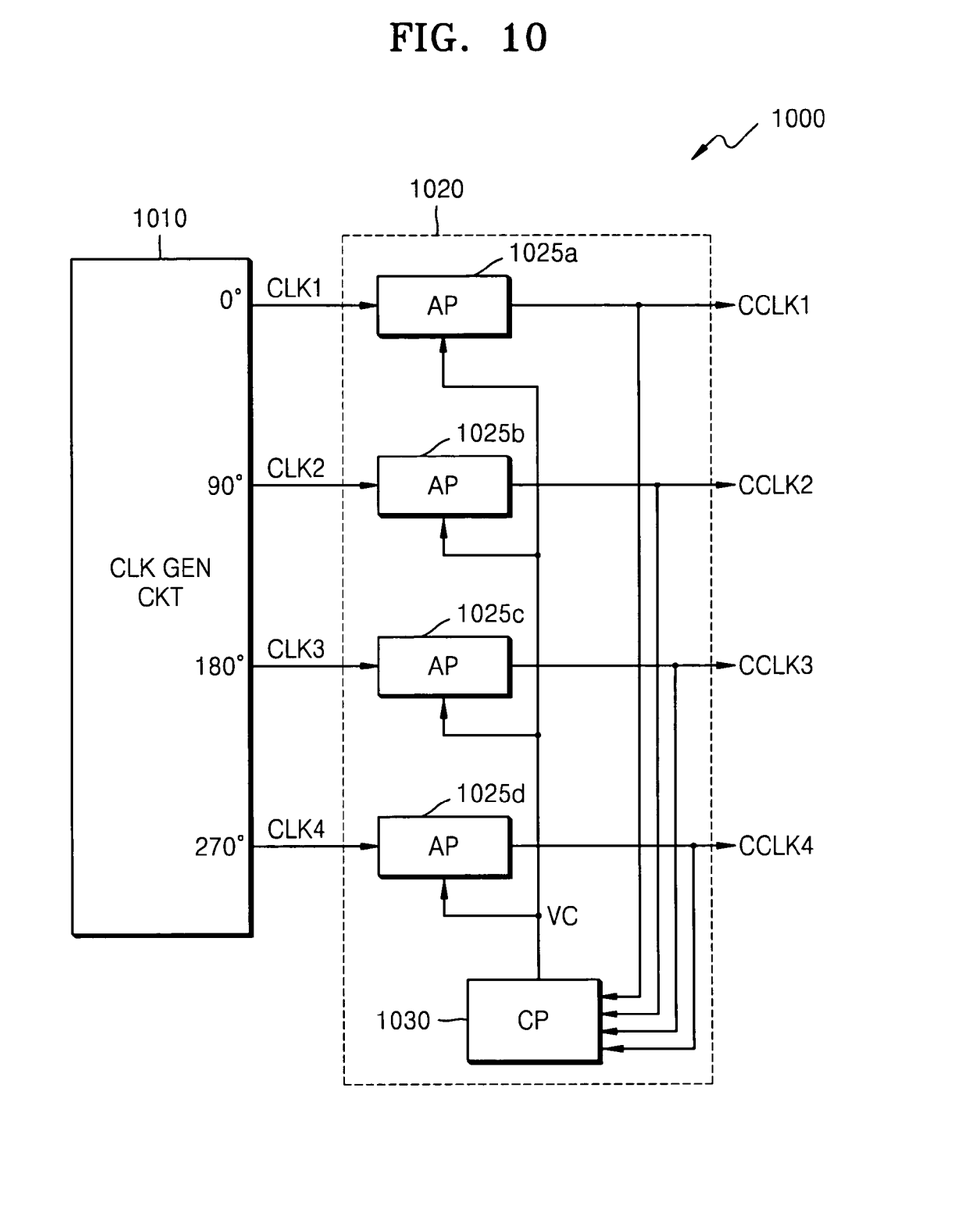
FIG. 10 is a block diagram showing an exemplary implementation of a clock generation circuit according to another exemplary embodiment of the present invention.

Referring to FIG. 10, a semiconductor device 1000 according to another exemplary embodiment of the present invention comprises a clock generation circuit 1010. In an exemplary implementation, a PLL may be employed, in which case clock generation circuit 1010 may be implemented by a VCO. In another exemplary implementation, a DLL may be employed, in which case clock generation circuit 1010 may be implemented by a VCDL.

As shown in the FIG. 10, a DCC circuit 1020 according to another exemplary embodiment of the present invention is implemented by shared charge pump CP 1030 (instead of independent charge pumps of a conventional DCC circuit as shown in, for example, FIG. 5) to compensate duty cycle errors of each of intermediate single-ended clock signals CLK1, CLK2, CLK3 and CLK4. Accordingly, the chip area as well as the power consumption caused by the charge pumps of the DCC can be reduced as compared to a conventional arrangement. The shared CP of the DCC circuit controls the voltage value of VC in response to the duty cycle's average value of signals CCLK1,CCLK2,CCLK3 and CCLK4. VC is output by the shared CP to APs 1025a, 1025b, 1025c and 1025d.

Figure 11A:
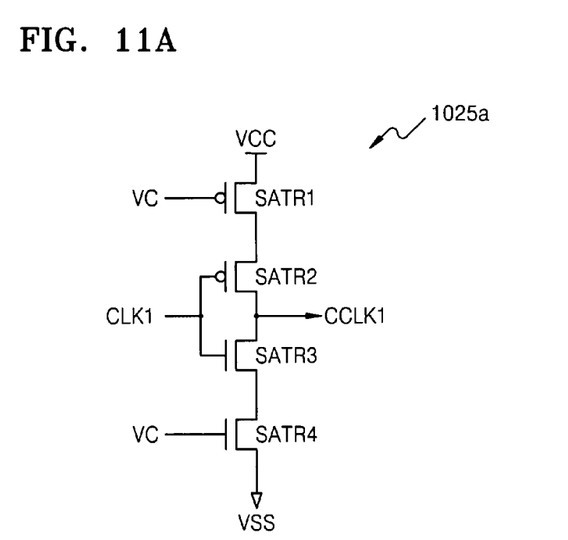
FIG. 11a is a circuit diagram showing an exemplary implementation of an amplification part according to another exemplary embodiment of the present invention.

Referring to FIG. 11a, in an exemplary implementation of the present invention, AP 1025a (as well as any or all of APs 1025b, 1025c and 1025d) comprises transistors SATR2/SATR3 which receive intermediate singe-ended clock signal CLK1 and output first internal clock signal CCLK1. Transistors SATR2/SATR3 are driven by transistors SATR1/SATR4, respectively, which receive the control signal VC output by the shared CP.

Figure 11B:
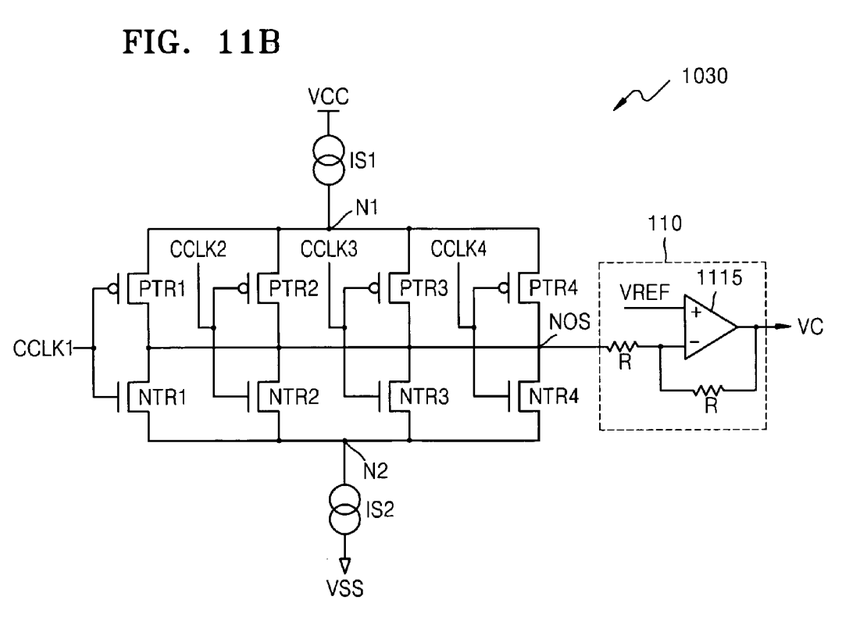
FIG. 11b is a circuit diagram showing an exemplary implementation of a charge pump according to another exemplary embodiment of the present invention.

Referring to FIG. 11b, in an exemplary implementation of the present invention, shared CP 1030 comprises an output part 110 and an input driver comprising four pairs of transistors PTR1/NTR1, PTR2/NTR2, PTR2/NTR2, PTR2/NTR2 which are connected to a first current source IS1 at a common node N1 and connected to a second current source IS2 at a common node N2. Transistor pairs PTR1/NTR1, PTR2/NTR2, PTR2/NTR2, PTR2/NTR2 are configured to receive signals CCLK1, CCLK2, CCLK3, CCLK4 and generate a shared output at node NOS. Output part 110 comprises an amplifier 1115. Amplifier 1115 is configured to receive a reference voltage VREF and the output of node NOS as the inputs thereof, and to output the control voltage signal VC.

During operation, a duty cycle error of CLK1 may be adjusted in response to the voltage value of control voltage signal VC to output first internal clock signal CCLK1 which keeps a normal duty cycle (50%:50%). For example, if the high interval of CLK1 is longer than the low interval of CLK1, the voltage value of VC is relatively high (as will be understood from the circuit diagram of an exemplary pump circuit 1030 of FIG. 11b), and therefore, the driving capability of transistor SATR4 is much higher than that of transistor SATR1. Thus, the high interval of CCLK1 is shorter than in a previous step while the low interval of CCLK1 is longer than in a previous step.

Figure 14:
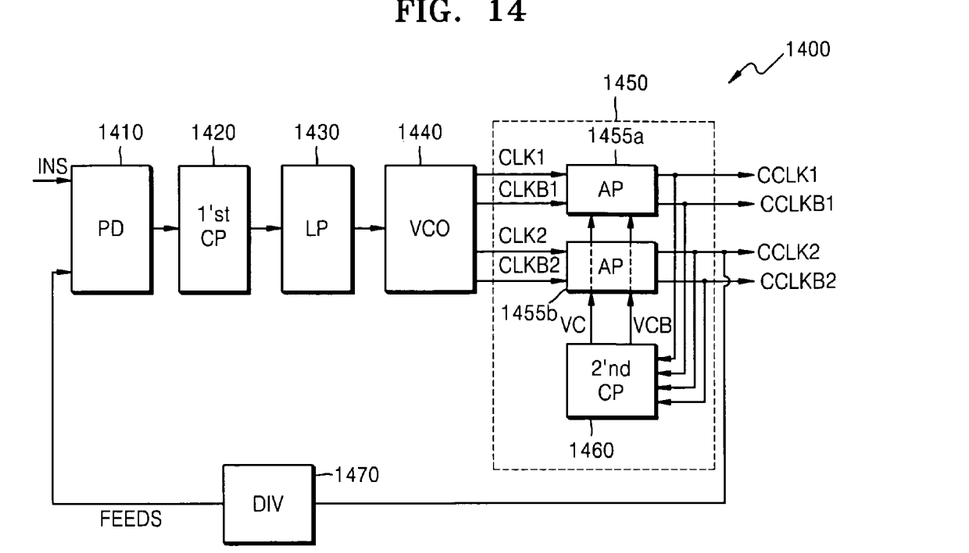
FIG. 14 is a block diagram showing an exemplary implementation of a PLL circuit according to another exemplary embodiment of the present invention.

Referring to FIG. 14, another exemplary embodiment of the present invention provides a PLL circuit 1400 which incorporates a duty cycle correction (DCC) circuit 1450 comprising APs 1455a, 1455b and a shared second CP 1460 which may be configured as shown in FIGS. 6-9. In the exemplary implementation shown in FIG. 14, PLL circuit 1400 comprises a phase detector (PD) 1410, a first charge pump (CP) 1420, a loop filter (LP) 1430, a voltage controlled oscillator (VCO) 1440, a divider (DIV) 1470 and the DCC circuit 1450. VCO 1440 outputs two pairs of differential clock signals CLK1/CLKB1, CLK2/CLKB2 to DCC circuit 1450.

In another exemplary implementation, VCO 1450 may be configured to output a plurality of single-ended clock signals, in which case the DCC circuit 1450 would be configured accordingly (see, for example, FIGS. 10, 11a and 11b). In yet another exemplary implementation of a PLL 1400, external clock signal INS locks with one of the first internal clock signals, such as CCLK2.

Figure 15:
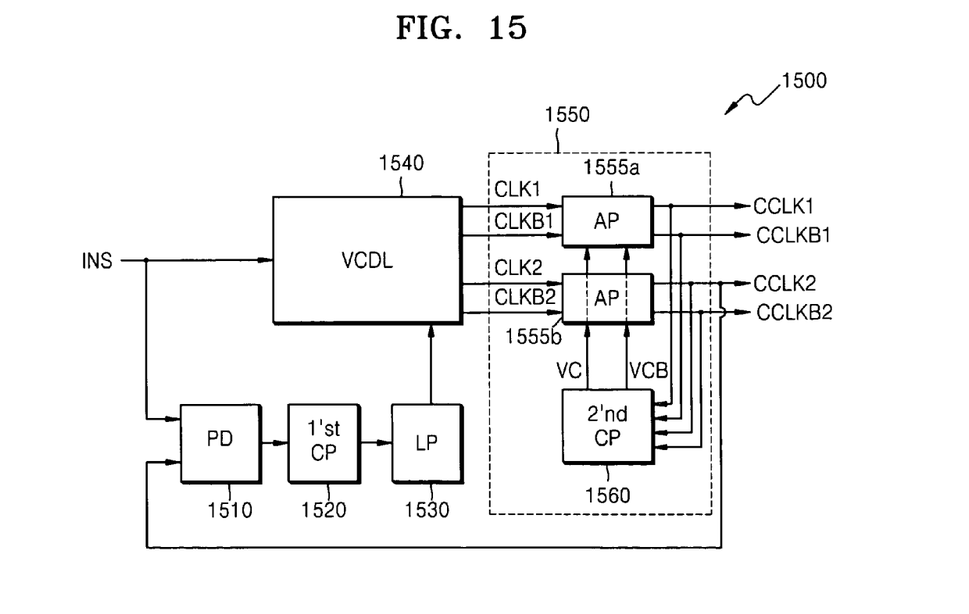
FIG. 15 is a block diagram showing an exemplary implementation of a DLL circuit according to yet another exemplary embodiment of the present invention.

Referring to FIG. 15, another exemplary embodiment of the present invention provides a DLL circuit 1500 which incorporates a duty cycle correction (DCC) circuit 1550 comprising APs 1555a, 1555b and a shared second CP 1560 which may be configured as shown in FIGS. 6-9. In the exemplary implementation shown in FIG. 15 DLL circuit 1500 comprises a phase detector (PD) 1510, a first charge pump (CP) 1520, a loop filter (LP) 1530, a voltage controlled delay line (VCDL) 1540, and the DCC circuit 1550. VCDL 1540 outputs two pairs of differential clock signals CLK1/CLKB1, CLK2/CLKB2 to DCC circuit 1550. DLL 1500 comprises a VCDL 1540 (instead of VCO 1404 of PLL 1400 as illustrated in FIG. 14) which delays an external clock signal by a predetermined time and outputs a plurality of intermediate clock signals having a constant phase difference (90 degree phase difference) between adjacent clock signals.

In another exemplary implementation, VCDL 1550 may be configured to output a plurality of single-ended clock signals, in which case the DCC circuit 1550 would be configured accordingly (see, for example, FIGS. 10, 11a and 11b). In yet another exemplary implementation of a DLL 1500, external clock signal INS locks with one of the first internal clock signals, such as CCLK2.

Figure 16:
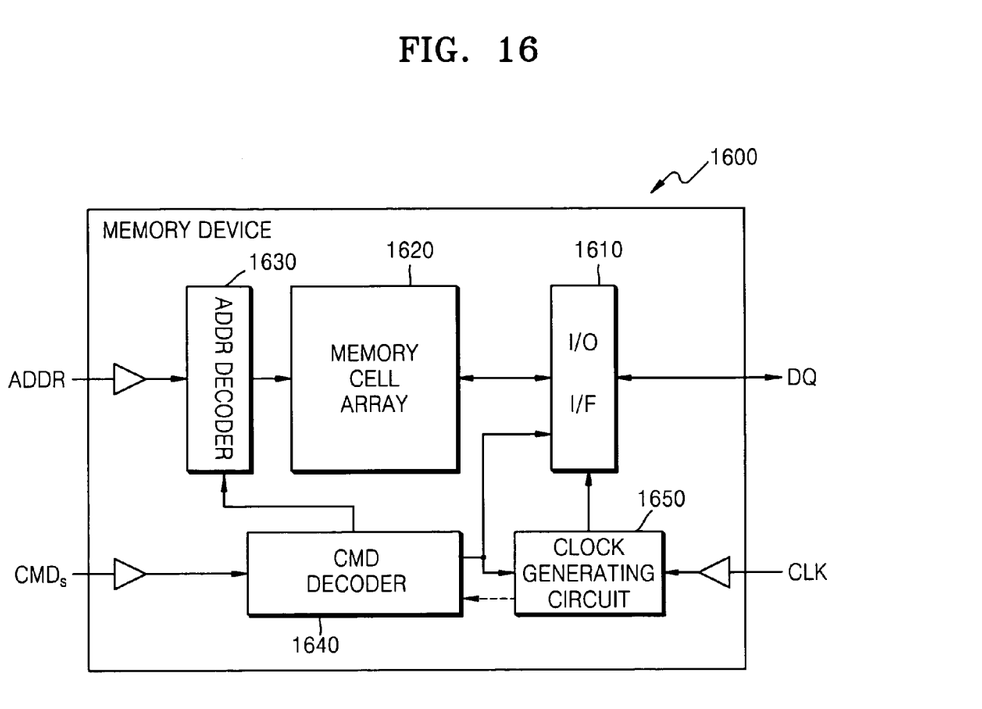
FIG. 16 is a block diagram showing an exemplary implementation of a memory device according to yet another exemplary embodiment of the present invention.

Referring to FIG. 16, another exemplary embodiment of the present invention provides a memory device 1600 comprising an Input/Output part 1610, a memory cell array 1620, an address decoder 1630, a command decoder 1640 and a clock generating circuit 1650. The clock generating circuit may comprise a PLL circuit (as shown, for example, in FIG. 14) or a DLL circuit (as shown, for example, in FIG. 15) which implement a DCC circuit having a shared CP as shown in corresponding FIGS. 1-11.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A duty cycle correction circuit configurable for use in a clock generation circuit, the duty cycle correction circuit comprising:
   a first amplification circuit configured to receive a first pair of intermediate differential clock signals, and to output a first pair of internal clock signals;
   a second amplification circuit configured to receive a second pair of intermediate differential clock signals, and to output a second pair of internal clock signals; and
   a charge pump configured to receive the first and second pair of internal clock signals, and to output a control signal based on the first and second pair of internal clock signals;
   wherein the first and second amplification circuits adjust duty cycles of the first and second pair of intermediate differential clock signals based on the control signal, respectively.

2. The duty cycle correction circuit as claimed in claim 1, wherein a correction of the duty cycles of the first and second pair of internal clock signals is based on the control signal.

3. The duty cycle correction circuit as claimed in claim 1, wherein the control signal comprises a first and second voltage control signals, and the charge pump comprises:
   an output part comprising a first node outputting the first voltage control signal and a second node outputting the second voltage control signal;
   an input driver configure to receive the first and second pair of internal clock signals and to output the first and second control voltage signals at the first and second nodes, respectively, based on the internal clock signals; and
   a capacitive element configured with respect to the first and second nodes.

4. The duty cycle correction circuit as claimed in claim 3, wherein the capacitive element is configured to maintain a substantially constant voltage difference between the first control voltage signal and the second control voltage signal.

5. The duty cycle correction circuit as claimed in claim 4, wherein the capacitive element comprises a capacitor connected between the first and the second nodes.

6. The duty cycle correction circuit as claimed in claim 3, wherein the input driver comprises:
   a first pair of transistor elements configured to receive a first internal clock signal of the first pair of internal clock signals and a third internal clock signal of the second pair of internal clock signals, respectively, and to output the first control voltage signal at the first node; and
   a second pair of transistor elements configured to receive a second internal clock signal of the first pair of internal clock signals and a fourth internal clock signal of the second pair of internal clock signals, respectively, and to output the second control voltage signal at the second node.

7. The duty cycle correction circuit as claimed in claim 3, wherein the charge pump further comprises:
   a first current source connected at the first node; and
   a second current source connected at the second node.

8. The duty cycle correction circuit as claimed in claim 3, wherein the charge pump further comprises a first driving current source connected to the input driver.

9. The duty cycle correction circuit as claimed in claim 8, wherein the input driver comprises:
   a first pair of transistor elements configured to receive a first internal clock signal of the first pair of internal clock signals and a third internal clock signal of the second pair of internal clock signals, respectively, and to output the first control voltage signal at the first node;
   a second pair of transistor elements configured to receive a second internal clock signal of the first pair of internal clock signals and a fourth internal clock signal of the second pair of internal clock signals, respectively, and to output the second control voltage signal at the second node; and
   wherein the first driving current source is connected to the first and second pair of the transistor elements at a third node, whereby the first and second pair of the transistor elements are driven by the first driving current source.

10. The duty cycle correction circuit as claimed in claim 8, wherein the charge pump further comprises a second driving current source connected to the input driver.

11. The duty cycle correction circuit as claimed in claim 10, wherein the input driver comprises:
   a first transistor element configured to receive a first internal clock signal of the first pair of internal clock signals;
   a second transistor element configured to receive a third internal clock signal of the second pair of internal clock signals, wherein the first and second transistor elements are configured to output the first control voltage signal at the first node;
   a third transistor element configured to receive a second internal clock signal of the first pair of internal clock signals; and
   a fourth transistor element configured to receive a fourth internal clock signal of the second pair of internal clock signals, wherein the third and fourth transistor elements are configured to output the second control voltage signal at the second node;

wherein the first driving current source is connected to the first and third transistor elements at a third node, whereby the first and third transistor elements are driven by the first driving current source, and the second driving current source is connected to the second and fourth transistor elements at a fourth node, whereby the second and fourth transistor elements are driven by the second driving current source.

12. The duty cycle correction circuit as claimed in claim 1, wherein the control signal comprises a first and second voltage control signals, and at least one of the first and second amplification circuits comprises:

a first transistor element configured to receive a first intermediate differential clock signal of a pair of the differential intermediate clock signals;

a second transistor element configured to receive a second intermediate differential clock signal of the pair of the differential intermediate clock signals;

a third transistor element configured to receive the first voltage control signal;

a fourth transistor element configured to receive the second voltage control signal;

wherein the first and third transistor elements are configured to output a second internal clock signal of a pair of the internal clock signals at a first node, and the second and fourth transistor elements are configured to output a first internal clock signal of the pair of the internal clock signals at a second node.

13. The duty cycle correction circuit as claimed in claim 12, wherein the at least one of the first and second amplification circuits further comprises:

a first driving current source connected to the first and second transistor elements at a third node, whereby the first and second transistor elements are driven by the first driving current source; and a second driving current source connected to the third and fourth transistor elements at a fourth node, whereby the third and fourth transistor elements are driven by the second driving current source.

14. An integrated circuit comprising:
a duty cycle correction circuit comprising:
a first amplification circuit configured to receive a first pair of intermediate differential clock signals, and to output a first pair of internal clock signals,
a second amplification circuit configured to receive a second pair of intermediate differential clock signals, and to output a second pair of internal clock signals, and
a charge pump configured to receive the first and second pair of internal clock signals, and to output a control signal based on the first and second pair of internal clock signals,
wherein the first and second amplification circuits adjust duty cycles of the first and second pair of intermediate differential clock signals, based on the control signal respectively; and
a clock generation circuit which outputs the first and second pair of intermediate differential clock signals.

15. A phase lock loop (PLL) circuit comprising:
a duty cycle correction circuit comprising:
a first amplification circuit configured to receive a first pair of intermediate differential clock signals, and to output a first pair of internal clock signals,
a second amplification circuit configured to receive a second pair of intermediate differential clock signals, and to output a second pair of internal clock signals, and
a second charge pump configured to receive the first and second pair of internal clock signals, and to output a second control signal based on the first and second pair of internal clock signals,
wherein the first and second amplification circuits adjust duty cycles of the first and second pair of intermediate differential clock signals, based on the second control signal respectively;
a phase detector configured to receive an external clock signal and one of the internal clock signals to output a first control signal;
a first charge pump and a loop filter configured to receive the first control signal and to output a control voltage based on the first control signal; and
a voltage controlled oscillator configured to receive the control voltage and to output the first and second pair of intermediate differential clock signals.

16. A delay lock loop (DLL) circuit comprising:
a duty cycle correction circuit comprising:
a first amplification circuit configured to receive a first pair of intermediate differential clock signals, and to output a first pair of internal clock signals,
a second amplification circuit configured to receive a second pair of intermediate differential clock signals, and to output a second pair of internal clock signals, and
a second charge pump configured to receive the first and second pair of internal clock signals, and to output a second control signal based on the first and second pair of internal clock signals,
wherein the first and second amplification circuits adjust duty cycles of the first and second pair of intermediate differential clock signals, based on the second control signal respectively;
a phase detector configured to receive an external clock signal and one of the internal clock signals to output a first control signal;
a first charge pump and a loop filter configured to receive the first control signal and to output a control voltage based on the first control signal; and
a voltage controlled delay line configured to receive the first control voltage and to output the first and second pair of intermediate differential clock signals.

17. The PLL circuit as claimed in claim 15, wherein the external clock signal locks with one of the internal clock signals.

18. The DLL circuit as claimed in claim 16, wherein the external clock signal locks with one of the internal clock signals.

19. A memory device comprising:
a duty cycle correction circuit comprising:
a first amplification circuit configured to receive a first pair of intermediate differential clock signals, and to output a first pair of internal clock signals,
a second amplification circuit configured to receive a second pair of intermediate differential clock signals, and to output a second pair of internal clock signals, and
a charge pump configured to receive the first and second pair of internal clock signals, and to output a control signal based on the first and second pair of internal clock signals,
wherein the first and second amplification circuits adjust duty cycles of the first and second pair of intermediate differential clock signals, based on the control signal respectively;
a memory cell array;

an input/output circuit configured to receive/output data signals from/to the memory cell array; and a clock generating circuit comprising the duty cycle correction circuit;

wherein the clock generating circuit is configured to receive an external clock signal, and output the first and second pair of internal clock signals to the input/output circuit.

20. The memory circuit as claimed in claim 19, further comprising:

an address decoder operatively connected to the memory cell array and configured to receive an address signal; and a command decoder operatively connected to the input/output circuit and configured to receive a command signal.

21. A duty cycle correction circuit configurable for use in a clock generation circuit, the duty cycle correction circuit comprising:

a first amplification circuit configured to receive a first intermediate single-ended clock signal, and to output a first internal clock signal;

a second amplification circuit configured to receive a second intermediate single-ended clock signal, and to output a second internal clock signal; and a charge pump configured to receive the first and second internal clock signals, and to output a control voltage signal based on the first and second internal clock signals;

wherein the first and second amplification circuits adjust duty cycles of the first and second intermediate single-ended clock signals in response to the control voltage signal, respectively.

22. The duty cycle correction circuit as claimed in claim 21, wherein the charge pump comprises:

an input driver configured to receive the first and second internal clock signals and to output a first voltage value at a first node based on the first and second internal clock signal; and an output part configured to receive the first voltage value at the first node and a reference voltage value, and to output the control voltage signal.

23. The duty cycle correction circuit as claimed in claim 22, wherein the input driver comprises:

a first pair of transistor elements configured to receive the first internal clock signal, and to output a first voltage value at the first node; and a second pair of transistor elements configured to receive the second internal clock signal, and to output a second voltage value at the first node.

24. The duty cycle correction circuit as claimed in claim 23, wherein the charge pump further comprises:

a first current source connected at a second node; and a second current source connected at a third node;

wherein a first transistor element of the first pair of the transistor elements and a third transistor element of the second pair of transistor elements are connected to the second node, and a second transistor element of the first pair of the transistor elements and a fourth transistor element of the second pair of transistor elements are connected to the third node.

25. The duty cycle correction circuit as claimed in claim 21, wherein at least one of the first and second amplification circuits comprises:

a first and fourth transistor elements configured to receive the control voltage signal; and a second and third transistor elements configured to receive an intermediate single-ended clock signal and to output an internal clock signal.

26. The duty cycle correction circuit as claimed in claim 25, wherein a duty cycle error of the intermediate single-ended clock signal is adjusted in response to a voltage value of the control voltage signal, whereby the duty cycle of the internal clock signal is normalized.

27. The duty cycle correction circuit as claimed in claim 21, further comprising:

a third amplification circuit configured to receive a third intermediate single-ended clock signal, and to output a third internal clock signal; and a fourth amplification circuit configured to receive a fourth intermediate single-ended clock signal, and to output a fourth internal clock signal;

wherein the charge pump is configured to receive the first, second, third and fourth internal clock signals, the control voltage signal is based on the first, second, third and fourth internal clock signals, and the first, second, third and fourth amplification circuits adjust duty cycles of the first, second, third and fourth intermediate single-ended clock signals in response to the control voltage signal, respectively.

28. The duty cycle correction circuit as claimed in claim 27, wherein a correction of the duty cycles of the first, second, third and fourth internal clock signals is based on the control voltage signal.

29. A method for generating a clock signal, the method comprising:

generating a first and second pair of intermediate differential clock signals;

inputting the first pair of intermediate differential clock signals into a first amplification circuit to generate a first pair of internal clock signals;

inputting the second pair of intermediate differential clock signals into a second amplification circuit to generate a second pair of internal clock signals;

inputting the first and second pair of internal clock signals into a charge pump to generate a control voltage signal based on the first and second pair of internal clock signals; and inputting the control voltage signal into at least one of the first and second amplification circuits to adjust duty cycles of the first and second pair of intermediate differential clock signals based on the control voltage signal, respectively.

30. The method as claimed in claim 29, further comprising correcting the duty cycles of the first and second pair of internal clock signals based on the control voltage signal.

* * * * *